United States Patent
Kawada et al.

(10) Patent No.: US 7,504,042 B2
(45) Date of Patent: Mar. 17, 2009

(54) PIEZOELECTRIC CERAMIC COMPOSITION AND PIEZOELECTRIC CERAMIC ELECTRONIC COMPONENT

(75) Inventors: Shinichiro Kawada, Hikone (JP); Katsuhiro Horikawa, Shiga-ken (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 11/723,093

(22) Filed: Mar. 16, 2007

(65) Prior Publication Data
US 2008/0036334 A1 Feb. 14, 2008

Related U.S. Application Data

(63) Continuation of application No. PCT/JP2005/015251, filed on Aug. 23, 2005.

(30) Foreign Application Priority Data
Oct. 1, 2004 (JP) ............... 2004-289972

(51) Int. Cl.
C04B 35/00 (2006.01)
(52) U.S. Cl. ............... 252/62.9 PZ; 501/134; 501/136
(58) Field of Classification Search .......... 252/62.9 PZ; 501/134, 136
See application file for complete search history.

(56) References Cited

U.S. PATENT DOCUMENTS

| | | | |
|---|---|---|---|
| 6,280,650 B1 * | 8/2001 | Ogawa et al. | 252/62.9 PZ |
| 6,423,245 B1 * | 7/2002 | Ogiso | 252/62.9 PZ |
| 6,627,104 B1 * | 9/2003 | Wang et al. | 252/62.9 PZ |
| 7,161,284 B2 | 1/2007 | Ebigase et al. | |
| 2002/0043653 A1 | 4/2002 | Ogiso | |
| 2004/0021399 A1 * | 2/2004 | Ogawa et al. | 310/311 |
| 2004/0072670 A1 * | 4/2004 | Kasukawa et al. | 501/134 |

FOREIGN PATENT DOCUMENTS

| | | |
|---|---|---|
| JP | 2-301174 | 12/1990 |
| JP | 7-41363 | 2/1995 |
| JP | 7-045883 | 2/1995 |
| JP | 07041363 A | 2/1995 |
| JP | H07-041363 A * | 2/1995 |

(Continued)

OTHER PUBLICATIONS

Written Opinion of the International Searching Authority dated Sep. 27, 2005.

*Primary Examiner*—Karl E Group
*Assistant Examiner*—Noah S Wiese
(74) *Attorney, Agent, or Firm*—Dickstein Shapiro LLP (57) ABSTRACT

A piezoelectric ceramic composition is represented by $[(Pb_{1-x}X_x)_a\{(Ni_{b/3}Nb_{2/3})_cTi_dZr_{1-c-d}\}O_3]$ in which X is at least one of Sr, Ba, Ca and La), and the compositional amounts x, a, b, c, and d respectively satisfy $0.001 \leq x \leq 0.1$, $0.930 \leq a \leq 0.998$, $1.02 \leq b \leq 1.40$, $0.1 \leq c \leq 0.6$ and $0.3 \leq d \leq 0.6$. The specific surface area of the material powder before firing is preferably set to 5 m²/g or more. A piezoelectric ceramic body 1 is fabricated using the piezoelectric ceramic composition. In this manner, a sufficiently high piezoelectric constant can be obtained not only in the electric field range of 400 to 500 V/mm but also in an electric field range of 1 kV/mm or more. Furthermore, a piezoelectric ceramic composition that can be fired at a low-temperature and a piezoelectric ceramic electronic component using this composition can be provided.

20 Claims, 2 Drawing Sheets

FOREIGN PATENT DOCUMENTS

| | | |
|---|---|---|
| JP | 11-29357 | 2/1999 |
| JP | 2001-302348 | 10/2001 |
| JP | 2001-302348 A | 10/2001 |
| JP | 2002-226266 | 8/2002 |
| JP | 2003-063866 | 3/2003 |

\* cited by examiner

PIEZOELECTRIC CERAMIC COMPOSITION AND PIEZOELECTRIC CERAMIC ELECTRONIC COMPONENT

This is a continuation of application Serial No. PCT/JP2005/015251, filed Aug. 23, 2005.

TECHNICAL FIELD

The present invention relates to a piezoelectric ceramic composition and a piezoelectric ceramic electronic component such as a multilayer piezoelectric actuator or a piezoelectric buzzer produced by using the piezoelectric ceramic composition.

BACKGROUND ART

A piezoelectric ceramic composition containing, as a primary component, $Pb(Zr,Ti)O_3$, which is a solid solution of a ferroelectric material, $PbTiO_3$ and an antiferroelectric material, $PbZrO_3$, has been widely used as a raw material of piezoelectric ceramic electronic components.

With the recent advancement in ceramic thin-layer technology, multilayer piezoelectric ceramic electronic components driven at high electric field have been developed and put to practice.

A piezoelectric ceramic material for high-field drive preferably has a high piezoelectric constant under a high electric field, which is the electric field encountered in actual use. In this respect, for example, a piezoelectric ceramic composition represented by formula $aPbTiO_3+bPbZrO_3+cPb(Ni_{1/3}Nb_{2/3})O_3$, wherein a, b, and c are in predetermined molar content ranges and Pb is reduced to the range of 0 to 3 mol % (excluding 0%), has been proposed (patent document 1).

According to patent document 1, the piezoelectric constant under a high electric field (about 400 to 500 V/mm) is improved by reducing the Pb content, which is the A-site component, to below the stoichiometric amount.

A multilayer piezoelectric ceramic electronic component is usually fabricated by laminating ceramic green sheets provided with internal electrode patterns and then firing the resulting laminate. A conductive material, such as Ag—Pd, mainly composed of Ag, which is less costly than Pt or the like, is preferably used as the material for the internal electrodes. Thus, a ceramic material that can be sintered at a low temperature is desired so that the internal electrode material and the ceramic material can be cosintered.

In view of the above, a piezoelectric ceramic composition of a perovskite type represented by general formula $ABO_3$ whose basic composition is $XPb_\beta(Ni_{\alpha/3}Nb_{2/3})O_3$—$YPbZrO_3$-$ZPbTiO_3$ has been proposed, wherein X, Y, and Z satisfy $0.20 \leq X \leq 0.60$, $0.15 \leq Y \leq 0.60$, and $0.30 \leq Z \leq 0.60$, the Ni at the B-site is in stoichiometric excess, i.e., in the range of $1 < \alpha < 2$, and the Pb at the A-site is in stoichiometric excess, i.e., in the range of $1 < \beta \leq 1.06$ (patent document 2).

In patent document 2, the ratio of Ni to Nb is adjusted such that the Ni is in stoichiometric excess and the ratio of the A-site to the B-site is adjusted such that the A-site is in stoichiometric excess to thereby enable low-temperature firing. In this manner, the ceramic material and the internal electrode material can be co-sintered at a low temperature without using an expensive refractory noble metal material such as platinum (Pt) as the internal electrode material.

Patent document 1: Japanese Unexamined Patent Application Publication No. 2001-302348

Patent document 2: Japanese Unexamined Patent Application Publication No. 7-45883

DISCLOSURE OF INVENTION

Problems to be Solved by Invention

However, although patent document 1 can be used under a high electric field when compared to a conventional piezoelectric ceramic composition, which is designed for use in a relatively low electric field, a high temperature of 1100° C. to 1300° C. is required to sinter with the ceramic material. For example, if the composition is co-sintered with an internal electrode paste containing 70 percent by weight or more of Ag (which has a low melting point), a sufficient piezoelectric constant cannot be obtained. Moreover, even when a satisfactory sinter is obtained, the electric field which is regarded as "high electric field" is about 400 to 500 V/mm; when a higher electric field is applied, it is difficult to obtain a desired high piezoelectric constant.

Patent document 2 can be fired at a low temperature and thus the ceramic material and the internal electrode material can be co-sintered. However, it is not designed for high electric field application.

The present invention has been made under these circumstances. An object thereof is to provide a piezoelectric ceramic composition that can yield a sufficiently high piezoelectric constant under not only a electrical field range of 400 to 500 V/mm but also a high electrical field of 1 kV/mm or more and that can be fired at a low temperature, and a piezoelectric ceramic electronic component made using the piezoelectric ceramic composition.

Means for Solving the Problems

The present inventors have conducted intensive investigations to overcome the above-described problems and have found that a piezoelectric ceramic composition that can yield a high piezoelectric constant $|d_{31}|$ of 350 pC/N or more under application of a high electric field of 1 kV/mm or more and that can be fired at a low temperature can be obtained from a three-component-system perovskite complex oxide, $PbTiO_3$—$PbZrO_3$—$Pb(Ni,Nb)O_3$, in which the A-site component of the perovskite represented by general formula: $ABO_3$ is decreased to below the stoichiometric amount and the ratio of Ni to Nb is adjusted such that Ni is in stoichiometric excess.

The present invention has been made based on this finding. The piezoelectric ceramic composition of the present invention is represented by a compositional formula $[Pb_a\{(Ni_{b/3}Nb_{2/3})_cTi_dZr_{1-c-d}\}O_3]$, characterized in that compositional amounts a, b, c, and d respectively satisfy $0.930 \leq a \leq 0.998$, $1.02 \leq b \leq 1.40$, $0.1 \leq c \leq 0.6$ and $0.3 \leq d \leq 0.6$.

Based on the investigations, the present inventors have also found that by substituting part of Pb with at least one of Sr, Ba, Ca, and La at a compositional amount of 0.001 to 0.1 on a molar basis, a piezoelectric ceramic composition having a higher piezoelectric constant $|d_{31}|$ of 450 pC/N or more under application of a high electric field can be obtained.

That is, the piezoelectric ceramic composition of the present invention is represented by a compositional formula $[(Pb_{1-x}X_x)_a\{(Ni_{b/3}Nb_{2/3})_cTi_dZr_{1-c-d}\}O_3]$, characterized in that X is at least one of Sr, Ba, Ca and La and compositional amounts x, a, b, c and d respectively satisfy $0.001 \leq x \leq 0.1$, $0.930 \leq a \leq 0.998$, $1.02 \leq b \leq 1.40$, $0.1 \leq c \leq 0.6$ and $0.3 \leq d \leq 0.6$.

Based on the further investigations, the present inventors have also found that the material powder can be made further finer and the homogeneity and crystallinity of the ceramic material can be further increased by adjusting the specific surface area of the material powder before firing to 5 m²/g or more. When compared with the material with a specific surface area of less than 5 m²/g, a piezoelectric constant under a high electric field is further improved.

Thus, a preferred piezoelectric ceramic composition of the present invention is characterized in that the specific surface area of a material powder before firing is 5 m²/g or more.

A piezoelectric ceramic electronic component of the present invention is characterized in including a piezoelectric ceramic body including the piezoelectric ceramic composition.

The piezoelectric ceramic electronic component of the present invention is also characterized in that an internal electrode is buried in the piezoelectric ceramic body, and the internal electrode is prepared by sintering a conductive paste containing Ag as a main component.

Advantages

According to the piezoelectric ceramic composition of the present invention, since the composition is represented by a compositional formula [Pb$_a${(Ni$_{b/3}$Nb$_{2/3}$)$_c$Ti$_d$Zr$_{1-c-d}$}O$_3$], wherein compositional amounts a, b, c and d respectively satisfy 0.930≦a≦0.998, 1.02≦b≦1.40, 0.1≦c≦0.6 and 0.3≦d≦0.6, the Pb content is reduced to be lower than the stoichiometric amount and the ratio of Ni to Nb is adjusted so that the Ni is in stoichiometric excess. In this manner, a piezoelectric ceramic composition that exhibits a high piezoelectric constant under application of a high electric field of 1 kV/mm or more can be obtained. Moreover, a piezoelectric ceramic composition that exhibits excellent piezoelectric constant can be obtained by low-temperature firing.

When the composition is represented by a compositional formula [(Pb$_{1-x}$X$_x$)$_a${(Ni$_{b/3}$Nb$_{2/3}$)$_c$Ti$_d$Zr$_{1-c-d}$}O$_3$], X is at least one of Sr, Ba, Ca and La, and compositional amounts x, a, b, c and d respectively satisfy 0.001≦x≦0.1, 0.930≦a≦0.998, 1.02≦b≦1.40, 0.1≦c≦0.6 and 0.3≦d≦0.6, the piezoelectric constant can be further improved under application of high electric field.

Moreover, when the specific surface area of the material powder before firing is 5 m²/g or more, the piezoelectric constant can be further improved under application of high electric field.

According to the piezoelectric ceramic electronic component of the present invention, since the piezoelectric ceramic body is composed of the piezoelectric ceramic composition described above, a piezoelectric ceramic electronic component that exhibits high piezoelectric constant under application of high electric field can be easily fabricated.

Moreover, since the piezoelectric ceramic electronic component of the present invention has internal electrode(s) buried in the piezoelectric ceramic body and the internal electrode is prepared by sintering an electrode paste containing Ag as a main component, a multilayer piezoelectric ceramic electronic component can be fabricated by low-temperature sintering by cosintering the piezoelectric ceramic material and, for example, an internal electrode material containing 70 percent by weight of more of Ag. Moreover, a multilayer piezoelectric electronic component that exhibits excellent piezoelectric constant can be easily fabricated.

BEST MODE FOR CARRYING OUT THE INVENTION

Embodiments of the present invention will now be described in detail.

A piezoelectric ceramic composition of a first embodiment of the present invention includes a three-component-system complex oxide, PbTiO$_3$—PbZrO$_3$—Pb(Ni,Nb)O$_3$ having a perovskite structure (general formula: ABO$_3$), represented by composition formula (A) below:

$$Pb_a\{(Ni_{b/3}Nb_{2/3})_cTi_dZr_{1-c-d}\}O_3 \qquad (A)$$

where composition amounts a, b, c and d respectively satisfy mathematical formulae (1) to (4) below:

$$0.930 \leq a \leq 0.998 \qquad (1)$$

$$1.02 \leq b \leq 1.40 \qquad (2)$$

$$0.1 \leq c \leq 0.6 \qquad (3)$$

$$0.3 \leq d \leq 0.6 \qquad (4)$$

By reducing the amount of Pb constituting the A-site by a predetermined amount from the stoichiometric amount and adjusting the ratio of Ni to Nb at the B-site so that Ni is in stoichiometric excess, a piezoelectric ceramic composition that exhibits a high piezoelectric constant |d$_{31}$| of 350 pC/N or more under application of a high electric field of about 1 kV/mm can be obtained by low-temperature firing.

That is, while the piezoelectric ceramic composition exhibits piezoelectricity in a ferroelectric phase at and below the Curie point, the crystal grains are divided into many regions with different spontaneous polarization directions, which are called domains, during the phase transfer from the paraelectric phase to the ferroelectric phase via the Curie point. By polarization, although most of the domains are oriented in the direction of the 180° domain, some of the domains remain in the direction of the 90° domain. The piezoelectric constant decreases as the number of 90° domains increases.

Conventionally, adjusting the ratio of Ni to Nb such that Nb is in stoichiometric excess has been known as a method of easily rotating the 90° domains. In such a case, it is presumed that since the formation of oxygen pores is inhibited, the pinning effect of the domains by the oxygen pores is reduced to thereby facilitate rotation of the 90° domains and resulting in an increased piezoelectric constant.

However, based on the experimental results, the present inventors have found that a sufficiently high piezoelectric constant cannot be obtained under application of a high electric field of 1 kV or more even when the ratio of Ni to Nb is adjusted such that Nb is in stoichiometric excess.

The present inventors have conducted intensive investigations and found that a high piezoelectric constant can be obtained under a high electric field by adjusting the ratio of Ni to Nb so that Ni is in stoichiometric excess and reducing the amount of Pb constituting the A-site by a predetermined amount from the stoichiometric amount. Although not wishing to be bound by theory, this is presumably due to the fact that, when a sufficiently high electric field is applied, the force of rotation and deformation of the domains under high electric field application exceeds the pinning effect of the domains by the oxygen pores. Thus, the domains are rotated and deformed in a uniform manner.

Based on these findings, the present inventors have conceived that the piezoelectric constant under a high electric field is rarely dependent on the number of the oxygen pores but is dependent on the crystallinity in the crystal grains or homogeneity of the ceramic material. In other words, the present inventors have conceived that in order to increase the piezoelectric constant under high electric field application, it is important to improve the crystallinity in the crystal grains or the homogeneity of the ceramic material.

It has been conceived that by reducing the compositional amount a of Pb constituting the A-site by a predetermined amount from the stoichiometric amount (=1.000) and adjusting the ratio of Ni to Nb such that Ni exceeds the stoichiometric amount (=1/3) by a predetermined amount, generation of a pyrochlore phase, i.e., the non-piezoelectric phase composed of Pb and Nb, can be inhibited, and the crystallinity in the crystal grains and the homogeneity of the ceramic material can be increased. Thus, it can be presumed that these phenomena also contribute to the advantage of the present invention of increasing the piezoelectric constant under high electric field application.

By inhibiting generation of the pyrochlore phase with excess Ni, sinterability can be improved and low-temperature firing is enabled.

By reducing the compositional amount a of Pb constituting the A-site by a predetermined amount from the stoichiometric amount and adjusting the ratio of Ni to Nb so that Ni is in stoichiometric excess, a piezoelectric ceramic composition that can yield a high piezoelectric constant $|d_{31}|$ of 350 pC/N or more under application of a high electric field of 1 kV/mm or more can be obtained by low-temperature firing.

The reasons for limiting the compositional amounts a to d to mathematical formulae (1) to (4) above will now be described.

(1) Compositional Amount a

If the compositional amount a of Pb constituting the A-site becomes close to the stoichiometric amount by exceeding 0.998, although firing at low temperature is possible, the desired high piezoelectric constant cannot be obtained under high electric field application. In contrast, when the compositional amount a is less than 0.930, sinterability is degraded and a high piezoelectric constant cannot be obtained by low-temperature firing at 900° C. to 1000° C., for example.

Therefore, in this embodiment, the compositional amount a is set to $0.930 \leq a \leq 0.998$.

(2) Compositional Amount b

If the compositional amount b that defines the ratio of Ni to Nb is less than 1.02, then the Ni content relative to Nb becomes excessively small and the sinterability is thereby decreased. Thus, a high piezoelectric constant cannot be obtained by low-temperature firing. In contrast, if the compositional amount b exceeds 1.40, although low-temperature firing is possible, the desired high piezoelectric constant cannot be obtained under application of high electric field.

Therefore, in this embodiment, the compositional amount b is set to $1.02 \leq b \leq 1.40$.

(3) Compositional Amount c

If the compositional amount c of the (Ni,Nb) component at the B-site is less than 0.1, although low-temperature firing is possible, a high piezoelectric constant cannot be obtained under application of high electric field. In contrast, if the compositional amount c exceeds 0.6, the sinterability is degraded and a high piezoelectric constant cannot be obtained by low-temperature firing.

Therefore, in this embodiment, the compositional amount c is set to $0.1 \leq c \leq 0.6$.

(4) Compositional Amount d

When the compositional amount d of the Ti component at the B-site is less than 0.3 or more than 0.6, although low-temperature firing is possible in either cases, a desired high piezoelectric constant cannot be obtained under application of high electric field.

Therefore, in this embodiment, the compositional amount d is set to $0.3 \leq d \leq 0.6$.

When composition formula (A) satisfies mathematical formulae (1) to (4), a piezoelectric ceramic composition that exhibits a high piezoelectric constant $|d_{31}|$ of 350 pC/N or more can be obtained by low-temperature firing even when a high electric field of 1 kV/mm or more is applied.

Furthermore, although the A-site is constituted from Pb in the first embodiment described above, as shown by compositional formula (B) below, part of Pb is preferably substituted with at least one of Sr, Ba, Ca and La. In this manner, generation of a pyrochlore phase can be effectively inhibited, and the piezoelectric constant under high electric field can be further improved. A piezoelectric ceramic composition that has a piezoelectric constant $|d_{31}|$ as high as 450 pC/N or more can be obtained thereby. The resulting composition is $$(Pb_{1-x}X_x)_a\{(Ni_{b/3}Nb_{2/3})_cTi_dZr_{1-c-d}\}O_3 \qquad (B)$$

where the substitute element X represents at least one element selected from Sr, Ba, Ca and La.

The compositional amount x of the substitute element X is preferably $0.001 \leq x \leq 0.1$. This is because when the compositional amount x is less than 0.001, the effect of increasing the piezoelectric constant may not be exhibited. In contrast, when the compositional amount x exceeds 0.1, the compositional amount x of the substitute element X is excessive. This may degrade sinterability, decrease the Curie point, decrease the ferroelectricity, and drastically decrease the piezoelectric constant.

Next, a piezoelectric ceramic electronic component made using the piezoelectric ceramic composition is described.

Figure 1:
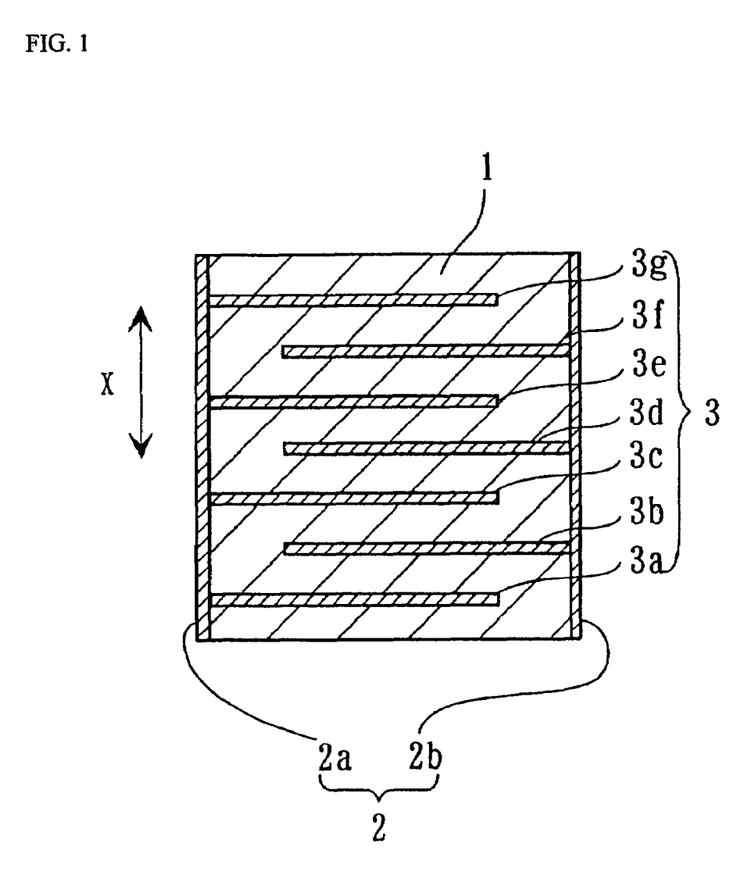
FIG. 1 is a cross-sectional view showing an embodiment of a multilayer piezoelectric actuator as a piezoelectric ceramic electronic component of the present invention.

FIG. 1 is a cross-sectional view showing an embodiment of a multilayer piezoelectric actuator, which is an example of a piezoelectric ceramic electronic component of the present invention. The multilayer piezoelectric actuator includes a piezoelectric ceramic body 1, external electrodes 2 (2a and 2b) formed on both ends of the piezoelectric ceramic body 1 and composed of a conductive material such as Ag, and internal electrodes 3 (3a to 3g) buried in the piezoelectric ceramic body 1, the internal electrodes being arranged in parallel to each other while opposing each other and composed of a conductive material such as Ag or Ag—Pd.

In the multilayer piezoelectric actuator, one end of each of the internal electrodes 3a, 3c, 3e and 3g is electrically coupled to the external electrode 2a and one end of each of the internal electrodes 3b, 3d and 3f is electrically coupled to the external electrode 2b. When a voltage is applied between the external electrode 2a and the external electrode 2b, the multilayer piezoelectric actuator deforms in the lamination direction indicated by the arrow X by a longitudinal piezoelectric effect.

A method for making the multilayer piezoelectric actuator will now be described in detail.

Predetermined amounts of ceramic raw materials, $Pb_3O_4$, $TiO_2$, $ZrO_2$, NiO and $Nb_2O_5$, and, if necessary, SrO, BaO, CaO and $La_2O_3$ are weighed, and the weighed materials are placed in a ball mill containing a milling medium such as zirconia and thoroughly wet-milled to obtain a ceramic material powder.

Subsequently, the ceramic material powder is calcined at a predetermined temperature (e.g., 600° C. to 1000° C.) to prepare a calcined material. The calcined material is again wet-milled in a ball mill to prepare a pre-firing material powder.

The specific surface area (SSA) of the pre-firing material powder is preferably 5 $m^2$/g or more.

By decreasing the particle size of the pre-firing material powder, the homogeneity and crystallinity of the piezoelectric ceramic body 1 improve after firing, and the piezoelectric constant under high electric field can be further increased. In order to yield such an advantage, the SSA of the pre-firing material powder is preferably 5 $m^2$/g or more, as described above.

When the SSA of the raw material powder is larger, the dispersibility of the ceramic material powder in the microscopic regions inside the crystal grains will further increase even though the SSA of the pre-firing material powder is the same. Thus, the piezoelectric constant under a high electric field can be further improved. In order to yield such an advantage, the SSA of the ceramic material powder is preferably 7 $m^2$/g or more.

Next, the pre-firing material powder prepared as above is mixed with an organic binder, and the resulting mixture is wet-mixed to form a slurry. The slurry was then shaped by the doctor blade method of the like to prepare ceramic green sheets.

Figure 2:
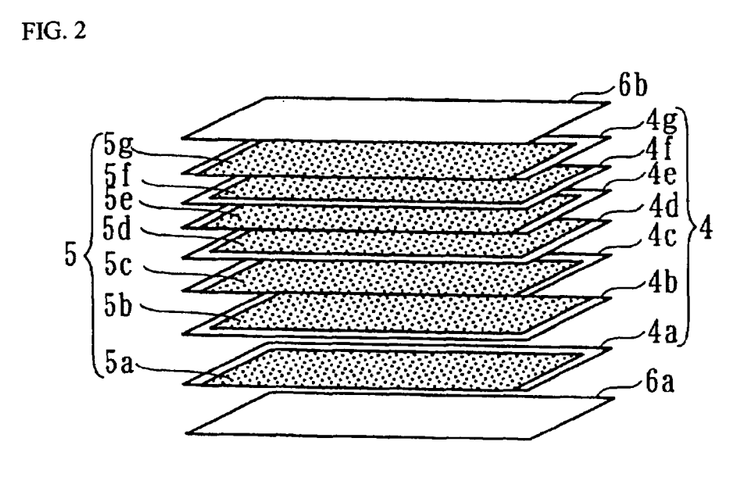
FIG. 2 is a perspective view of ceramic green sheets obtained in the course of fabricating the piezoelectric actuator.

As shown in FIG. 2, electrode patterns 5 (5a to 5g) are then formed by screen-printing using an internal electrode paste mainly composed of Ag or Ag—Pd on ceramic green sheets 4 (4a to 4g).

The ceramic green sheets 4a to 4g on which the electrode patterns 5 are provided are laminated, and are interposed between ceramic green sheets 6a and 6b which are not provided with electrode patterns 5, followed by press-bonding to prepare a laminate. The laminate is cut to a predetermined size, placed in an alumina sagger, subjected to debinding at a predetermined temperature (e.g., 250° C. to 500° C.), and fired at a predetermined temperature (e.g., 950° C. to 1100° C.) to form a piezoelectric ceramic body 1 with internal electrodes 3a to 3g buried therein.

As described above, since low-temperature firing is possible in this embodiment, a piezoelectric ceramic body 1 having internal electrodes buried therein can be easily prepared by laminating and cosintering the internal electrode conductive paste and the ceramic green sheets. In particular, when the internal electrode contains 70 percent by weight or more of Ag, delamination may occur and the coating ratio of the internal electrodes may decrease at a high firing temperature. Thus, this embodiment which enables low-temperature firing is useful.

Figure 3:
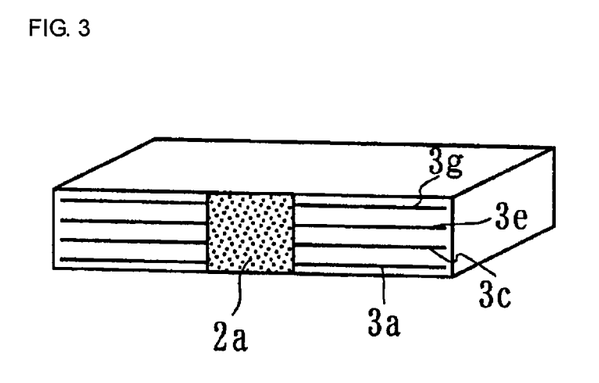
FIG. 3 is a perspective view of the piezoelectric actuator.

An external electrode paste composed of Ag or the like is applied on both ends of the piezoelectric ceramic body 1 and fired at a predetermined temperature (e.g., 750° C. to 850° C.) to form the external electrodes 2a and 2b shown in FIGS. 1 and 3. A predetermined polarization process is then conducted to prepare a multilayer piezoelectric actuator. Note that the external electrodes 2a and 2b may be prepared by another method, e.g., a thin-film forming method such as sputtering or vacuum deposition, as long as the adhesiveness is satisfactory.

In this embodiment, since the multilayer piezoelectric actuator is made using the piezoelectric ceramic composition of the present invention, the piezoelectric constant is high and the amount of displacement are large under application of a high electric field of 1 kV/mm. Since low-temperature firing at 1100° C. or less is possible, the ceramic green sheets and the internal electrode paste can be cosintered at a low temperature even when a conductive material mainly composed of Ag is used as the internal electrode material. According to the present invention a relatively inexpensive internal electrode material containing 70 percent by weight or more of Ag may be used in the internal electrodes.

Note that the present invention is not limited by the embodiments described above. For instance, although oxides, such as $Pb_3O_4$, are used as the ceramic raw materials, carbonates or hydroxides may be used instead.

In the embodiment described above, trace amounts of silica, alumina, iron, and the like may be contained as impurities in the piezoelectric ceramic composition. These impurities do not affect the characteristics.

Although the compositional amounts a, b, c, d and x in formulae (A) and (B) indicate ratios before firing, compositional amounts a, b, c, d and x remain substantially the same after firing. That is, although part of Pb is evaporated by firing, the compositional amount does not substantially change between before and after the firing.

Naturally, the piezoelectric ceramic electronic component may be applied not only to the multilayer piezoelectric actuator but also to a single-plate piezoelectric actuator, a bimorph piezoelectric actuator, and various other piezoelectric ceramic electronic components such as a piezoelectric oscillator, a piezoelectric buzzer, and a piezoelectric sensor.

Examples of the present invention will now be specifically described.

EXAMPLE 1

Ceramic raw materials, $Pb_3O_4$, $TiO_2$, $ZrO_2$, NiO and $Nb_2O_5$, were prepared and weighed to yield the compositional amounts described in Table 1. The weighed materials were thoroughly wet-mixed and milled in a ball mill with water to prepare a ceramic material powder having a specific surface area of 7 $m^2$/g.

Next, the ceramic material powder is calcined for 2 hours at a temperature of 600° C. to 1000° C., and again thoroughly wet-milled in a ball-mill to prepare a pre-firing material powder having a specific surface area of 5 $m^2$/g.

A vinyl acetate-based binder is added as a binder to the pre-firing material powder. The resulting mixture was mixed in a ball mill to prepare a slurry, and the slurry was formed into sheets by a doctor blade method to prepare ceramic green sheets.

The ceramic green sheets were laminated to form a laminate having a thickness of about 1.0 mm, and the laminate was compressed at a pressure of $4.9 \times 10^7$ to $1.96 \times 10^8$ Pa and fired at a firing temperature of 900° C. to 1100° C. to obtain a rectangular plate-shaped ceramic.

The rectangular plate-shaped ceramic was polished to a thickness of about 0.6 mm. A conductive paste mainly composed of Ag was applied on the two main surfaces of the ceramic and baked to form electrodes. An electric field of 3.0 kV/mm was applied thereto for 30 minutes in an insulating oil at 80° C. to conduct polarization. The resulting rectangular plate-shaped piezoelectric ceramic was cut to a length of about 13 mm and width of about 3 mm to obtain piezoelectric test pieces of Sample Nos. 1 to 24.

A high electric field of 1 kV/mm was applied to each sample piece to determine the piezoelectric constant $|d_{31}|$. In particular, the piezoelectric constant $|d_{31}|$ was determined by measuring the amount of displacement of the sample piece in the longitudinal direction under application of an electric field of 1 kV/mm with a displacement gauge, calculating the distortion by dividing the amount of displacement with the element length (in the longitudinal direction), and then dividing the distortion by the electric field.

Table 1 shows the compositions of Samples Nos. 1 to 24, the piezoelectric constant $|d_{31}|$ thereof, and the firing temperature. Each of the firing temperatures in Table 1 is the temperature at which the highest piezoelectric constant $|d_{31}|$ was obtained as a result of firing at a temperature ranging from 900° C. to 1100° C.

TABLE 1

| | $Pb_a\{(Ni_{b/3}Nb_{2/3})_cTi_dZr_{1-c-d}\}O_3$ | | | | | |
|---|---|---|---|---|---|---|
| Sample No. | a | b | c | d | Piezolectric constant $|d_{31}|$ (pC/N) | Firing temperature (° C.) |
| 1* | 0.920 | 1.05 | 0.25 | 0.40 | 250 | 1100 |
| 2 | 0.930 | 1.05 | 0.25 | 0.40 | 380 | 1100 |
| 3 | 0.970 | 1.05 | 0.25 | 0.40 | 410 | 1050 |
| 4 | 0.995 | 1.05 | 0.25 | 0.40 | 420 | 950 |
| 5 | 0.998 | 1.05 | 0.25 | 0.40 | 360 | 950 |
| 6* | 1.000 | 1.05 | 0.25 | 0.40 | 300 | 900 |
| 7* | 0.990 | 0.98 | 0.25 | 0.40 | 280 | 1100 |
| 8* | 0.990 | 1.00 | 0.25 | 0.40 | 290 | 1100 |
| 9 | 0.990 | 1.02 | 0.25 | 0.40 | 370 | 1100 |
| 10 | 0.990 | 1.05 | 0.25 | 0.40 | 430 | 1050 |
| 11 | 0.990 | 1.20 | 0.25 | 0.40 | 420 | 1050 |
| 12 | 0.990 | 1.30 | 0.25 | 0.40 | 420 | 1000 |
| 13 | 0.990 | 1.40 | 0.25 | 0.40 | 380 | 950 |
| 14* | 0.990 | 1.50 | 0.25 | 0.40 | 260 | 900 |
| 15* | 0.990 | 1.05 | 0.05 | 0.40 | 250 | 950 |
| 16 | 0.990 | 1.05 | 0.10 | 0.40 | 410 | 1000 |
| 17 | 0.990 | 1.05 | 0.40 | 0.40 | 430 | 1100 |
| 18 | 0.990 | 1.05 | 0.60 | 0.40 | 360 | 1100 |
| 19* | 0.990 | 1.05 | 0.70 | 0.40 | 200 | 1100 |
| 20* | 0.990 | 1.05 | 0.25 | 0.20 | 260 | 1050 |
| 21 | 0.990 | 1.05 | 0.25 | 0.30 | 350 | 1050 |
| 22 | 0.990 | 1.05 | 0.25 | 0.50 | 400 | 1050 |
| 23 | 0.990 | 1.05 | 0.25 | 0.60 | 350 | 1050 |
| 24* | 0.990 | 1.05 | 0.25 | 0.70 | 290 | 1050 |

*Asterisked samples are outside the invention.

As is apparent from Table 1, Sample No. 1 had a excessively low compositional amount a of Pb, 0.920, and did not sufficiently sinter at a firing temperature of 1100° C. due to poor sinterability. The piezoelectric constant $|d_{31}|$ was low as 250 pC/N and a piezoelectric member having a high piezoelectric constant could not be obtained.

Sample No. 6 had good sinterability and did sinter at a low temperature of 900° C. However, the compositional amount a was 1.000, and thus the ratio of the A-site to the B-site was stoichiometric. The piezoelectric constant $|d_{31}|$ was as low as 300 pC/N, and a piezoelectric member having a high piezoelectric constant could not be obtained.

Sample No. 7 had a compositional amount b of 0.98, and the ratio of Ni to Nb was such that Nb was in stoichiometric excess. The piezoelectric constant $|d_{31}|$ was as low as 280 pC/N, and a desired high piezoelectric constant could not obtained under application of a high electric field.

Sample No. 8 had a compositional amount b of 1.00, and the ratio of Ni to Nb was stoichiometric. Thus the sinterability was poor and the specimen did not sufficiently sinter at a firing temperature of 1100° C. The piezoelectric constant $|d_{31}|$ was as low as 290 pC/N, and a piezoelectric member having a high piezoelectric constant could not be obtained.

Sample No. 14 had good sinterability and did sinter at a low temperature of 900° C. However, since the compositional amount b was 1.50 and the Ni content was too high, the piezoelectric constant $|d_{31}|$ was as low as 260 pC/N, and a piezoelectric member having a high piezoelectric constant could not be obtained.

Sample No. 15 had good sinterability and did sinter at a low temperature of 950° C. However, since the compositional amount c was 0.05 and the (Ni,Nb) content in the B-site was excessively low, the piezoelectric constant $|d_{31}|$ was as low as 250 pC/N, and a piezoelectric member having a high piezoelectric constant could not be obtained.

Sample No. 19 had a compositional amount c of 0.70, and the (Ni,Nb) content in the B-site was excessively high. The sinterability was poor and the specimen did not sufficiently sinter at a firing temperature of 1100° C. The piezoelectric constant $|d_{31}|$ was as low as 200 pC/N, and a piezoelectric member having a high piezoelectric constant could not be obtained.

Sample No. 20 had good sinterability and did sinter at a low temperature of 1050° C. However, the compositional amount d was 0.20 and the Ti content in the B-site was excessively low. The piezoelectric constant $|d_{31}|$ was as low as 260 pC/N, and a piezoelectric member having a high piezoelectric constant could not be obtained.

As with Sample No. 20, Sample No. 24 had good sinterability and did sinter at a low temperature of 1050° C. However, the compositional amount d was 0.70, and the Ti content in the B-site was excessively high. The piezoelectric constant $|d_{31}|$ was as low as 290 pC/N, and a piezoelectric member having a high piezoelectric constant could not be obtained.

In contrast, Sample Nos. 2 to 5, 9 to 13, 16 to 18 and 21 to 23 had compositional amounts a to d within the ranges of $0.930 \leq a \leq 0.998$, $1.02 \leq b \leq 1.40$, $0.1 \leq c \leq 0.6$ and $0.3 \leq d \leq 0.6$ and thus were in the range of the present invention. Good sinterability was exhibited in the firing temperature range of 900° C. to 1100° C., and a piezoelectric member having a high piezoelectric constant $|d_{31}|$ of 350 pC/N or more could be obtained by such low-temperature firing.

EXAMPLE 2

The ceramic raw materials of EXAMPLE 1 and $SrCO_3$ were prepared and weighed to yield the compositional amounts described in Table 2. Piezoelectric test pieces of Sample Nos. 31 to 56 were prepared by the same process as in EXAMPLE 1.

Next, as in EXAMPLE 1, a high electric field of 1 kV/mm was applied to each of the piezoelectric test pieces to determine the piezoelectric constant $|d_{31}|$.

Table 2 shows the compositional amounts of Sample Nos. 31 to 56, the piezoelectric constant $|d_{31}|$ thereof, and the firing temperature. Each of the firing temperatures in Table 2 is the temperature at which the highest piezoelectric constant $|d_{31}|$ was obtained as a result of firing at a temperature ranging from 900° C. to 1100° C.

TABLE 2

| | $(Pb_{1-x}Sr_x)_a[(Ni_{b/3}Nb_{2/3})_cTi_dZr_{1-c-d}]O_3$ | | | | | | |
|---|---|---|---|---|---|---|---|
| Sample No. | x | a | b | c | d | Piezoelectric constant $|d_{31}|$ (pC/N) | Firing temperature (° C.) |
| 31* | 0.05 | 0.990 | 1.00 | 0.25 | 0.40 | 300 | 1100 |
| 32 | 0.05 | 0.990 | 1.02 | 0.25 | 0.40 | 510 | 1100 |
| 33 | 0.05 | 0.990 | 1.05 | 0.25 | 0.40 | 600 | 1050 |

TABLE 2-continued $(Pb_{1-x}Sr_x)_a[(Ni_{b/3}Nb_{2/3})_cTi_dZr_{1-c-d}]O_3$

| Sample No. | x | a | b | c | d | Piezoelectric constant $|d_{31}|$ (pC/N) | Firing temperature (° C.) |
|---|---|---|---|---|---|---|---|
| 34 | 0.05 | 0.990 | 1.20 | 0.25 | 0.40 | 580 | 1050 |
| 35 | 0.05 | 0.990 | 1.30 | 0.25 | 0.40 | 570 | 1000 |
| 36 | 0.05 | 0.930 | 1.40 | 0.25 | 0.40 | 500 | 1050 |
| 37* | 0.05 | 0.920 | 1.50 | 0.25 | 0.40 | 340 | 1100 |
| 38 | 0.05 | 0.990 | 1.40 | 0.25 | 0.40 | 530 | 950 |
| 39* | 0.05 | 0.990 | 1.50 | 0.25 | 0.40 | 340 | 900 |
| 40* | 0.05 | 0.920 | 1.05 | 0.25 | 0.40 | 160 | 1100 |
| 41 | 0.05 | 0.930 | 1.05 | 0.25 | 0.40 | 520 | 1100 |
| 42 | 0.05 | 0.970 | 1.05 | 0.25 | 0.40 | 580 | 1050 |
| 43 | 0.05 | 0.995 | 1.05 | 0.25 | 0.40 | 570 | 950 |
| 44 | 0.05 | 0.998 | 1.05 | 0.25 | 0.40 | 510 | 950 |
| 45* | 0.05 | 1.000 | 1.05 | 0.25 | 0.40 | 330 | 900 |
| 46* | 0.05 | 0.990 | 1.05 | 0.05 | 0.40 | 330 | 950 |
| 47 | 0.05 | 0.990 | 1.05 | 0.10 | 0.40 | 550 | 1000 |
| 48 | 0.05 | 0.990 | 1.05 | 0.40 | 0.40 | 570 | 1100 |
| 49 | 0.05 | 0.990 | 1.05 | 0.60 | 0.40 | 500 | 1100 |
| 50* | 0.05 | 0.990 | 1.05 | 0.70 | 0.40 | 330 | 1100 |
| 51* | 0.05 | 0.990 | 1.05 | 0.25 | 0.20 | 280 | 1050 |
| 52 | 0.05 | 0.990 | 1.05 | 0.25 | 0.30 | 480 | 1050 |
| 53 | 0.05 | 0.990 | 1.05 | 0.25 | 0.60 | 450 | 1050 |
| 54* | 0.05 | 0.990 | 1.05 | 0.25 | 0.70 | 300 | 1050 |
| 55 | 0.05 | 0.930 | 1.05 | 0.60 | 0.40 | 450 | 1100 |
| 56* | 0.05 | 0.920 | 1.05 | 0.70 | 0.40 | 330 | 1100 |

*Asterisked samples are outside the invention

As is apparent from Table 2, Sample Nos. 31, 37, 40, 50 and 56, as with Sample Nos. 1, 8 and 19 in EXAMPLE 1, exhibited poor sinterability and did not sufficiently sinter at 1100° C. The piezoelectric constant $|d_{31}|$ was 160 to 340 pC/N, and a piezoelectric member having a high piezoelectric constant could not be obtained.

As with Sample Nos. 6, 14, 15, 20 and 24, Sample Nos. 39, 45, 46, 51 and 54 exhibited good sinterability. However, the piezoelectric constant $|d_{31}|$ was 280 to 340 pC/N, and a piezoelectric member having a high piezoelectric constant could not be obtained.

In contrast, Sample Nos. 32 to 36, 41 to 44, 47 to 49, 52, 53 and 55 were in the ranges of $0.930 \leq a \leq 0.998$, $1.02 \leq b \leq 1.40$, $0.1 \leq c \leq 0.6$, and $0.3 \leq d \leq 0.6$ and thus were in the range of the present invention. Good sinterability was exhibited in the firing temperature range of 900° C. to 1100° C. Furthermore, since Sr at a compositional amount of 0.05 was dissolved in Pb at the A-site, the piezoelectric constant $|d_{31}|$ was increased to 450 pC/N or more. When compared to samples free of Sr (see Table 1), a piezoelectric member having a higher piezoelectric constant $|d_{31}|$ could be obtained.

Figure 4:
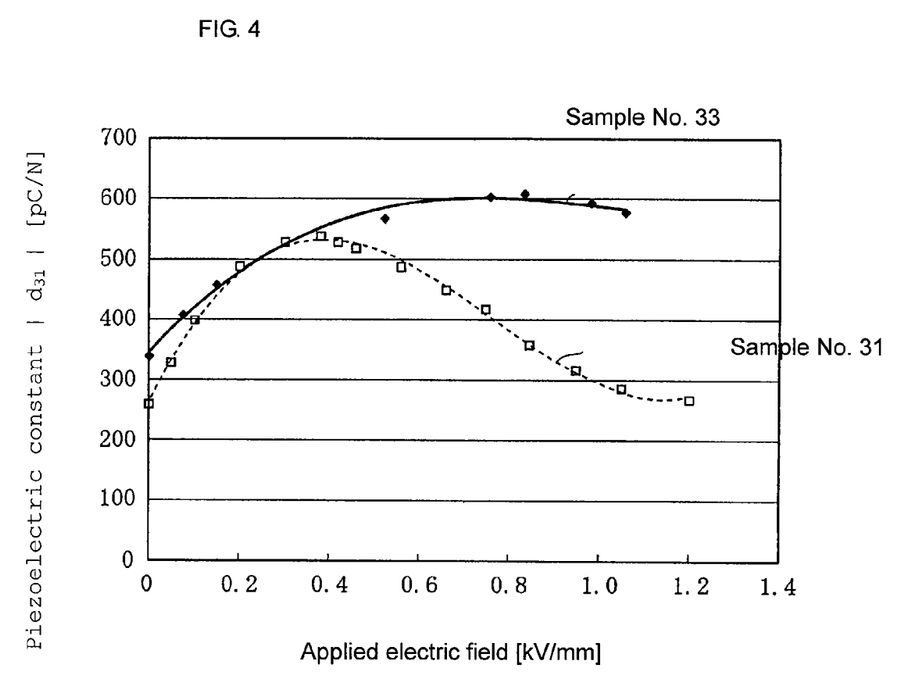
FIG. 4 is a graph showing both the piezoelectric characteristic of Sample No. 33 of the present invention and the piezoelectric characteristic of Sample No. 31 which is outside the present invention.

FIG. 4 is a graph showing both the piezoelectric characteristic of Sample No. 33 of the present invention and that of Sample No. 31 which is outside the present invention. The solid line indicates sample No. 33, and the broken line indicates Sample No. 31. The abscissa indicates the applied electric field (kV/mm) and the ordinate indicates the piezoelectric constant $|d_{31}|$ (pC/N).

FIG. 4 clearly shows that whereas the piezoelectric constant $|d_{31}|$ of Sample No. 31 decreased when the applied electric field was increased beyond 0.4 kV/mm, Sample No. 33 could maintain a high piezoelectric constant beyond 0.4 kV/mm. Furthermore, it was confirmed that the high piezoelectric constant could be maintained beyond an application field of 1 kV/mm.

EXAMPLE 3

The ceramic raw materials of EXAMPLE 2 and $BaCO_3$, $CaCO_3$ and $La_2O_3$ were prepared. These ceramic raw materials were weighed to give compositional amounts described in Table 3, and piezoelectric test pieces of Sample Nos. 61 to 75 were prepared by the same method as in EXAMPLE 1.

Next, as in EXAMPLE 1, a high electric field of 1 kV/mm was applied to each of the piezoelectric test pieces to determine the piezoelectric constant $|d_{31}|$.

Table 3 shows the compositional amounts of Sample Nos. 61 to 75, the piezoelectric constant $|d_{31}|$ thereof, and the firing temperature. Each of the firing temperatures in Table 3 is the temperature at which the highest piezoelectric constant $|d_{31}|$ was obtained as a result of firing at a temperature ranging from 900° C. to 1100° C.

TABLE 3

$(Pb_{1-x}X_x)_a\{(Ni_{b/3}Nb_{2/3})_cTi_dZr_{1-c-d}\}O_3$

| Sample No. | X | x | a | b | c | d | Piezoelectric constant $|d_{31}|$ (pC/N) | Firing temperature (° C.) |
|---|---|---|---|---|---|---|---|---|
| 61 | Sr | 0.001 | 0.990 | 1.05 | 0.25 | 0.40 | 550 | 1050 |
| 62 | Sr | 0.10 | 0.990 | 1.05 | 0.10 | 0.40 | 580 | 1100 |
| 63* | Sr | 0.15 | 0.990 | 1.05 | 0.10 | 0.40 | 240 | 1100 |
| 64 | Ba | 0.001 | 0.990 | 1.05 | 0.25 | 0.40 | 550 | 1050 |
| 65 | Ba | 0.05 | 0.990 | 1.05 | 0.25 | 0.40 | 560 | 1050 |
| 66 | Ba | 0.01 | 0.990 | 1.05 | 0.10 | 0.40 | 560 | 1100 |
| 67* | Ba | 0.15 | 0.990 | 1.05 | 0.10 | 0.40 | 250 | 1100 |
| 68 | Ca | 0.001 | 0.990 | 1.05 | 0.25 | 0.40 | 550 | 1050 |
| 69 | Ca | 0.05 | 0.990 | 1.05 | 0.25 | 0.40 | 550 | 1050 |
| 70 | Ca | 0.10 | 0.990 | 1.05 | 0.10 | 0.40 | 560 | 1100 |
| 71* | Ca | 0.15 | 0.990 | 1.05 | 0.25 | 0.40 | 220 | 1100 |
| 72 | La | 0.001 | 0.990 | 1.05 | 0.25 | 0.40 | 550 | 1100 |
| 73 | La | 0.05 | 0.990 | 1.05 | 0.25 | 0.40 | 560 | 1100 |
| 74 | La | 0.10 | 0.990 | 1.05 | 0.10 | 0.40 | 550 | 1100 |
| 75* | La | 0.15 | 0.990 | 1.05 | 0.10 | 0.40 | 170 | 1100 |

*Asterisked samples are outside the invention.

As is apparent from Table 3, Sample Nos. 63, 67, 71 and 75 exhibited poor sinterability and did not sufficiently sinter at a firing temperature of 1100° C. since the compositional amount x of Sr, Ba, Ca or La was excessively high, i.e., 0.15. The piezoelectric constant $|d_{31}|$ was 170 to 250 pC/N, and a piezoelectric member having a high piezoelectric constant could not be obtained.

In contrast, sample Nos. 61, 62, 64 to 66, 68 to 70 and 72 to 74 were in the ranges of $0.930 \leq a \leq 0.998$, $1.02 \leq b \leq 1.40$, $0.1 \leq c \leq 0.6$ and $0.3 \leq d \leq 0.6$ and the compositional amount x of the Sr, Ba, Ca or La at the A-site was 0.001 to 0.10. Good sinterability was exhibited in the firing temperature range of 900° C. to 1100° C. A piezoelectric member having a high piezoelectric constant $|d_{31}|$ of 550 to 580 pC/N could be obtained.

EXAMPLE 4

The ceramic raw materials were weighed to yield the compositional amounts as in Sample No. 33 in Table 2. The weighed materials were combined with water in a ball mill, and wet-mixing and milling was conducted by varying the milling time in the range of 0.5 to 100 hours to thereby prepare ceramic material powders of Sample Nos. 81 to 85 having different specific surface areas, as shown in Table 4.

Each ceramic material powder was calcined for 2 hours at a temperature of 600° C. to 1000° C., and then wet-mixed and milled in a ball mill by varying the milling time in the range of 0.5 to 100 hours to prepare pre-firing material powders of Sample Nos. 81 to 85 with different specific surface areas as shown in Table 4.

Subsequently, piezoelectric test pieces of Sample Nos. 81 to 85 were prepared by the same process as in EXAMPLE 1.

As in EXAMPLE 1, a high electric field of 1 kV/mm was applied to each of these piezoelectric test pieces to determine the piezoelectric constant $|d_{31}|$.

Table 4 shows the ceramic material powders and pre-firing material powders of Sample Nos. 81 to 85, the specific surface areas thereof, the piezoelectric constant $|d_{31}|$ thereof, and the firing temperature.

TABLE 4

| Sample No. | SSA of mixed raw materials (m²/g) | SSA of pre-firing materials (m²/g) | Piezoelectric constant $|d_{31}|$ (pC/N) | Firing temperature (° C.) |
|---|---|---|---|---|
| 81 | 5 | 1 | 500 | 1100 |
| 82 | 7 | 5 | 600 | 1100 |
| 83 | 10 | 5 | 630 | 1100 |
| 84 | 7 | 8 | 630 | 1050 |
| 85 | 10 | 8 | 650 | 1050 |

Table 4 clearly shows that Sample Nos. 82 to 85 whose pre-firing material powers had a SSA of 5 m²/g or more exhibited a piezoelectric constant $|d_{31}|$ higher than that of Sample No. 81 having a SSA of 1 m²/g. By adjusting the SSA of the pre-firing material powder to 5 m²/g or more, the piezoelectric constant $|d_{31}|$ under a high electric field could be further increased.

The comparison between Sample Nos. 82 and 84 shows that by increasing the SSA of the pre-firing material powder to 8 m²/g or more, the piezoelectric constant $|d_{31}|$ under 1 kV/mm could be further decreased and the firing temperature could be further decreased.

The comparison between Sample Nos. 82 and 83 and the comparison between sample Nos. 84 and 85 show that even when the SSA of the pre-firing material powder is the same, the piezoelectric constant $|d_{31}|$ under 1 kV/mm could be further improved by increasing the SSA of the ceramic raw material power to 10 m²/g.

The invention claimed is:

1. A piezoelectric ceramic composition represented by a compositional formula $[(Pb_{1-x}X_x)_a\{(Ni_{b/3}Nb_{2/3})_cTi_dZr_{1-c-d}\}O_3]$, wherein X is at least one element selected from the group consisting of Sr, Ba, Ca and La and compositional amounts x, a, b, c and d respectively satisfy $0 \leq x \leq 0.1$, $0.930 \leq a \leq 0.998$, $1.02 \leq b \leq 1.40$, $0.1 \leq c \leq 0.6$ and $0.3 \leq d \leq 0.6$.

2. The piezoelectric ceramic composition according to claim 1, wherein x is 0.

3. The piezoelectric ceramic composition according to claim 2, wherein the composition is a fired powder of ceramic raw materials collectively having said compositional formula, the fired power having a specific surface area before firing of 5 m²/g or more.

4. The piezoelectric ceramic composition according to claim 3, wherein the fired powder is made from ceramic raw materials having a specific surface area of 7 m²/g or more.

5. The piezoelectric ceramic composition according to claim 4, wherein the fired powder is made from ceramic raw materials having a specific surface area of 10 m²/g or more, and the fired powder before firing had a specific surface area of 8 m²/g or more.

6. The piezoelectric ceramic composition according to claim 1, wherein $0.970 \leq a \leq 0.995$, $1.05 \leq b \leq 1.30$, $0.25 \leq c \leq 0.4$ and $0.4 \leq d \leq 0.5$.

7. The piezoelectric ceramic composition according to claim 1, wherein $0.001 \leq x$.

8. The piezoelectric ceramic composition according to claim 7, wherein the composition is a fired powder of ceramic raw materials collectively having said compositional formula, the fired power having a specific surface area before firing of 5 m²/g or more.

9. The piezoelectric ceramic composition according to claim 8, wherein the fired powder is made from ceramic raw materials having a specific surface area of 7 m²/g or more.

10. The piezoelectric ceramic composition according to claim 9, wherein the fired powder is made from ceramic raw materials having a specific surface area of 10 m²/g or more, and the fired powder before firing had a specific surface area of 8 m²/g or more.

11. The piezoelectric ceramic composition according to claim 7, wherein $0.005 \leq x$, $0970 \leq a \leq 0.990$, $1.05 \leq b \leq 1.30$, $0.25 \leq c \leq 0.4$ and $0.4 \leq d \leq 0.5$.

12. The piezoelectric ceramic composition according to claim 7, wherein X is one of said elements.

13. The piezoelectric ceramic composition according to claim 7, wherein X is Sr.

14. A piezoelectric ceramic electronic component, comprising a piezoelectric ceramic body comprising the piezoelectric ceramic composition according to claim 1.

15. The piezoelectric ceramic electronic component according to claim 14, having at least one internal electrode buried in the piezoelectric ceramic body, and the internal electrode comprises Ag.

16. A piezoelectric ceramic electronic component, comprising a piezoelectric ceramic body comprising the piezoelectric ceramic composition according to claim 2.

17. The piezoelectric ceramic electronic component according to claim 16, having at least one internal electrode buried in the piezoelectric ceramic body, and the internal electrode comprises Ag.

18. A piezoelectric ceramic electronic component, comprising a piezoelectric ceramic body comprising the piezoelectric ceramic composition according to claim 7.

19. The piezoelectric ceramic electronic component according to claim 18, having at least one internal electrode buried in the piezoelectric ceramic body, and the internal electrode comprises Ag.

20. A piezoelectric ceramic electronic component, comprising a piezoelectric ceramic body comprising the piezoelectric ceramic composition according to claim 1, at least two internal electrodes each of which comprises at least 70% Ag buried in the piezoelectric ceramic body and spaced from one another, and at least two external electrodes disposed spaced from one another, wherein the two internal electrodes are electrically connected to different external electrodes.

* * * * *